United States Patent
Chang

(10) Patent No.: US 10,181,353 B2
(45) Date of Patent: Jan. 15, 2019

(54) MEMORY CONTROL CIRCUIT AND METHOD THEREOF

(71) Applicant: REALTEK SEMICONDUCTOR CORPORATION, Hsinchu (TW)

(72) Inventor: Ya-Min Chang, Kaohsiung (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 5 days.

(21) Appl. No.: 15/814,072

(22) Filed: Nov. 15, 2017

(65) Prior Publication Data

US 2018/0151232 A1 May 31, 2018

(30) Foreign Application Priority Data

Nov. 30, 2016 (TW) .............................. 105139373 A

(51) Int. Cl.
*G11C 16/26* (2006.01)
*G11C 16/32* (2006.01)
*G06F 13/14* (2006.01)
*G06F 13/42* (2006.01)
*G11C 8/06* (2006.01)

(52) U.S. Cl.
CPC .............. *G11C 16/26* (2013.01); *G06F 13/14* (2013.01); *G06F 13/4282* (2013.01); *G11C 8/06* (2013.01); *G11C 16/32* (2013.01)

(58) Field of Classification Search
CPC ..... G06F 13/14; G06F 13/4282; G11C 16/26; G11C 16/32
See application file for complete search history.

(56) References Cited

U.S. PATENT DOCUMENTS

| | | | | |
|---|---|---|---|---|
| 7,606,952 B2 * | 10/2009 | Chen | ................... | G06F 13/4291 710/58 |
| 8,181,056 B2 * | 5/2012 | Oh | ...................... | G06F 13/1689 713/401 |
| 2011/0271038 A1 * | 11/2011 | Ferrario | ............... | G11C 7/1051 711/103 |
| 2013/0073810 A1 * | 3/2013 | Alon | .................... | G06F 13/1663 711/137 |
| 2014/0344597 A1 * | 11/2014 | Thumma | ................. | G06F 1/324 713/322 |
| 2015/0248921 A1 * | 9/2015 | Chen | ...................... | G11C 5/063 711/103 |

* cited by examiner

*Primary Examiner* — Glenn A. Auve
(74) *Attorney, Agent, or Firm* — WPAT, PC

(57) ABSTRACT

This invention discloses a memory control circuit and a method thereof. The memory control method includes the steps of: transmitting a first clock to a serial peripheral interface (SPI) NOR flash memory; transmitting a read instruction to the SPI NOR flash memory; waiting for a read waiting time period, which is associated with a specification of the SPI NOR flash memory and a cycle of the first clock; waiting for a delay time period, which is associated with a delay setting value and a cycle of a second clock different from the first clock; receiving read data returned from the SPI NOR flash memory; and adjusting the delay time period according to whether the read data are correct or not. This invention improves the stability of read operation of the SPI NOR flash memory and has advantages of simple circuit and flexible adjustment.

10 Claims, 7 Drawing Sheets

MEMORY CONTROL CIRCUIT AND METHOD THEREOF

BACKGROUND OF THE INVENTION

1. Field of the Invention

The present invention relates to a memory control circuit, especially to a control circuit and method for a serial peripheral interface (SPI) NOR flash memory.

2. Description of Related Art

FIG. 1 shows a schematic diagram of an application circuit of a conventional serial peripheral interface (SPI) NOR flash memory. A system-on-chip (SoC) 30 and an SPI NOR flash memory 20 are disposed on a circuit board 10. The SoC 30 uses a memory control circuit 31 to access data of the SPI NOR flash memory 20. Due to possible data delay caused by a routing 41 between the SoC 30 and the SPI NOR flash memory 20, the SoC 30 further includes an intermediary circuit 32 for solving an issue of asynchronous data that is caused by the routing 41 on the circuit board 10. Thus, only data delay caused by an in-chip routing 42 needs to be considered in the design of the SoC 30. However, the intermediary circuit 32 may result in additional costs such as an increased circuit area and manufacturing costs of the SoC 30.

SUMMARY OF THE INVENTION

In view of the issues of the prior art, an object of the present invention is to provide a memory control circuit and a method thereof to solve the read delay of a serial peripheral interface (SPI) NOR flash memory.

According to an aspect of this invention, a memory control circuit is disclosed. The memory control circuit controls a serial peripheral interface (SPI) NOR flash memory, which operates according to a first clock. The memory control circuit includes an interface control unit, a serial control unit and a data control unit. The interface control unit receives a second clock. The serial control unit, which is coupled to the interface control unit and operates according to the second clock, transmits the first clock and a read instruction to the SPI NOR flash memory, and receives read data. The data control unit, which coupled to the interface control unit and the serial control unit, controls the serial control unit according to a delay setting value to wait for a predetermined time period before receiving the read data. The predetermined time period includes a delay time period and a read waiting time period required by the SPI NOR flash memory. The read waiting time period is a multiple of a cycle of the first clock. The delay time period is a multiple of a cycle of the second clock. The first clock is different from the second clock.

According to another aspect of this invention, a memory control method is disclosed. The memory control method controls a serial peripheral interface (SPI) NOR flash memory, which operates according to a first clock. The method includes steps of: receiving a second clock; transmitting the first clock and a read instruction to the SRI NOR flash memory; waiting for a predetermined time period according to a delay setting value before receiving read data; and receiving the read data. The predetermined time period includes a delay time period and a read waiting time period required by the SPI NOR flash memory. The read waiting time period is a multiple of a cycle of the first clock. The delay time period is a multiple of a cycle of the second clock. The first clock is different from the second clock.

According to still another aspect of this invention, a memory control method is disclosed. The memory control method controls a serial peripheral interface (SPI) NOR flash memory, which operates according to a first clock. The method includes steps of: transmitting the first clock to the SPI NOR flash memory; transmitting a read instruction to the SPI NOR flash memory; waiting for a read waiting time period, wherein the read waiting time period is associated with a specification of the SPI NOR flash memory and a cycle of the first clock; waiting for a delay time period, wherein the delay time period is associated with a delay setting value and a cycle of a second clock, and the first clock is different from the second clock; receiving read data returned from the SPI NOR flash memory; and adjusting the delay time period.

The memory control circuit and method of the present invention are capable of adaptively determining a delay time period to compensate the signal delay caused by a routing on the circuit board and/or an in-chip routing. Compared to conventional solutions, the present invention, without involving an additional circuit, enhances the stability of read operations of an SPI NOR flash memory, and further provides advantages of having a simple and flexibly adjustable circuit.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

Figure 1:
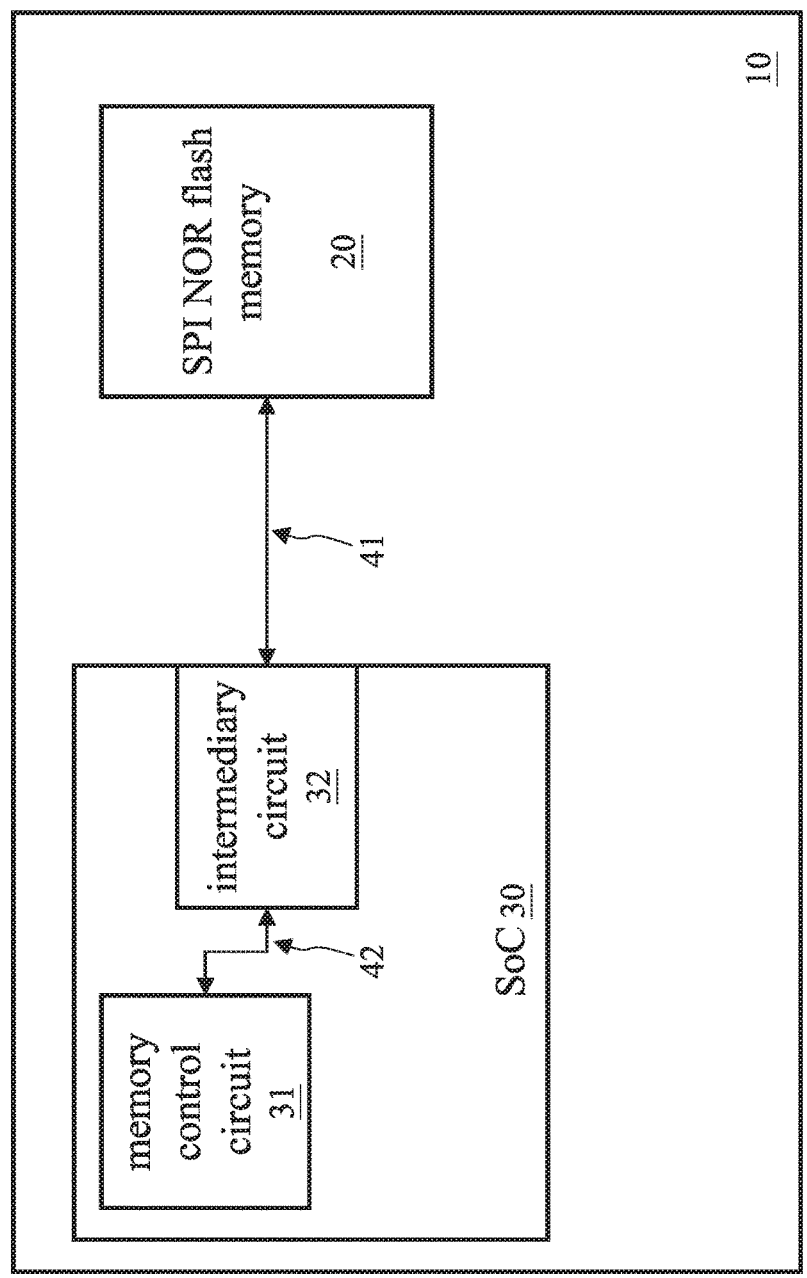
FIG. 1 illustrates a schematic diagram of an application circuit of a conventional serial peripheral interface (SPI) NOR flash memory.
Figure 2:
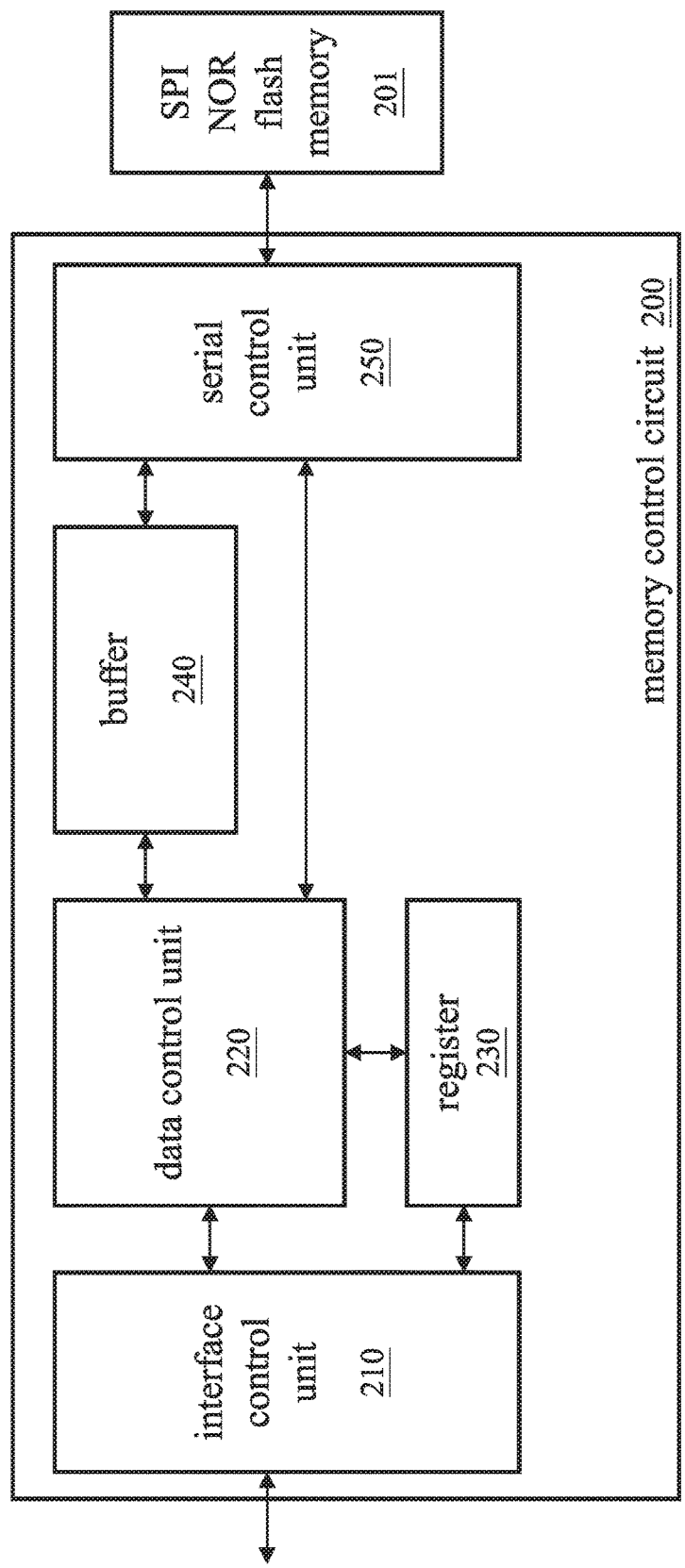
FIG. 2 illustrates a function block diagram of a memory control circuit according to an embodiment of the present invention.
Figure 3:
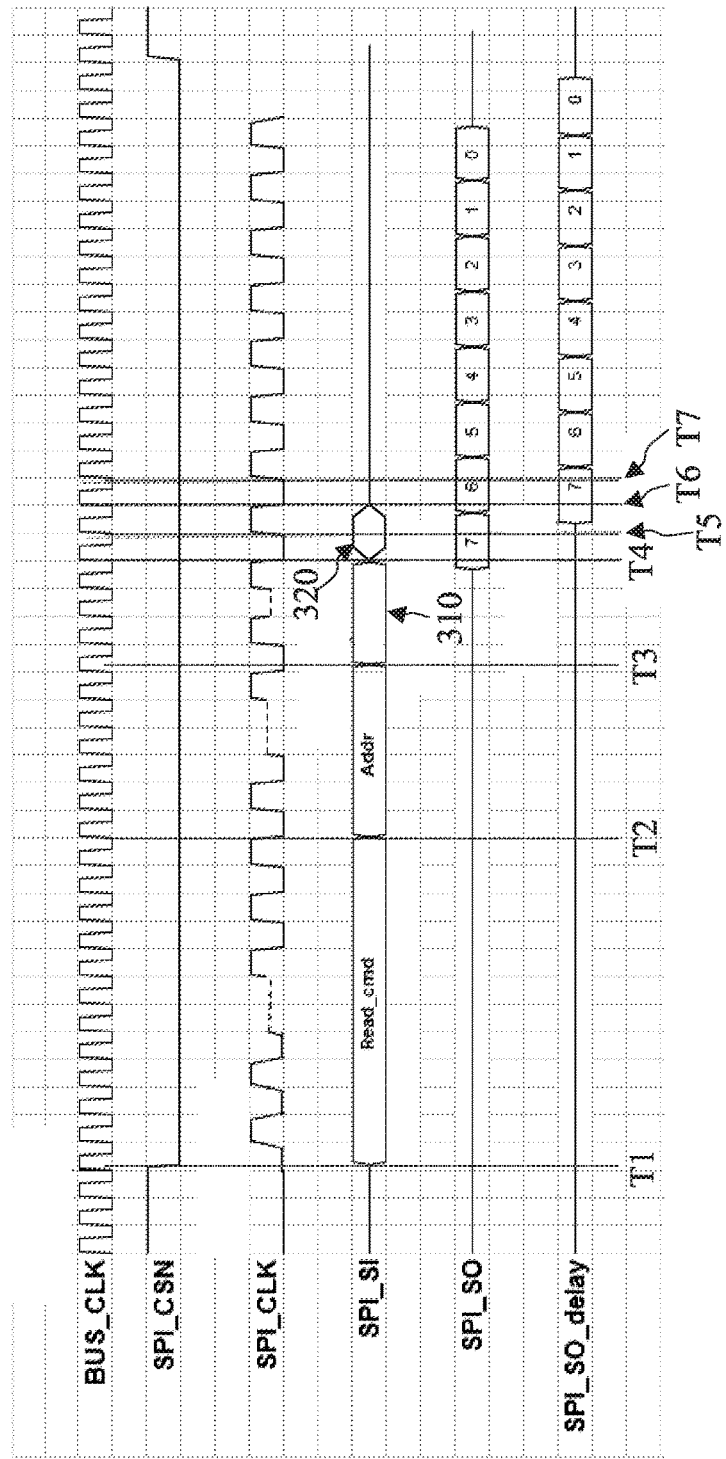
FIG. 3 illustrates a timing diagram of a read operation corresponding to FIG. 2.
Figure 4:
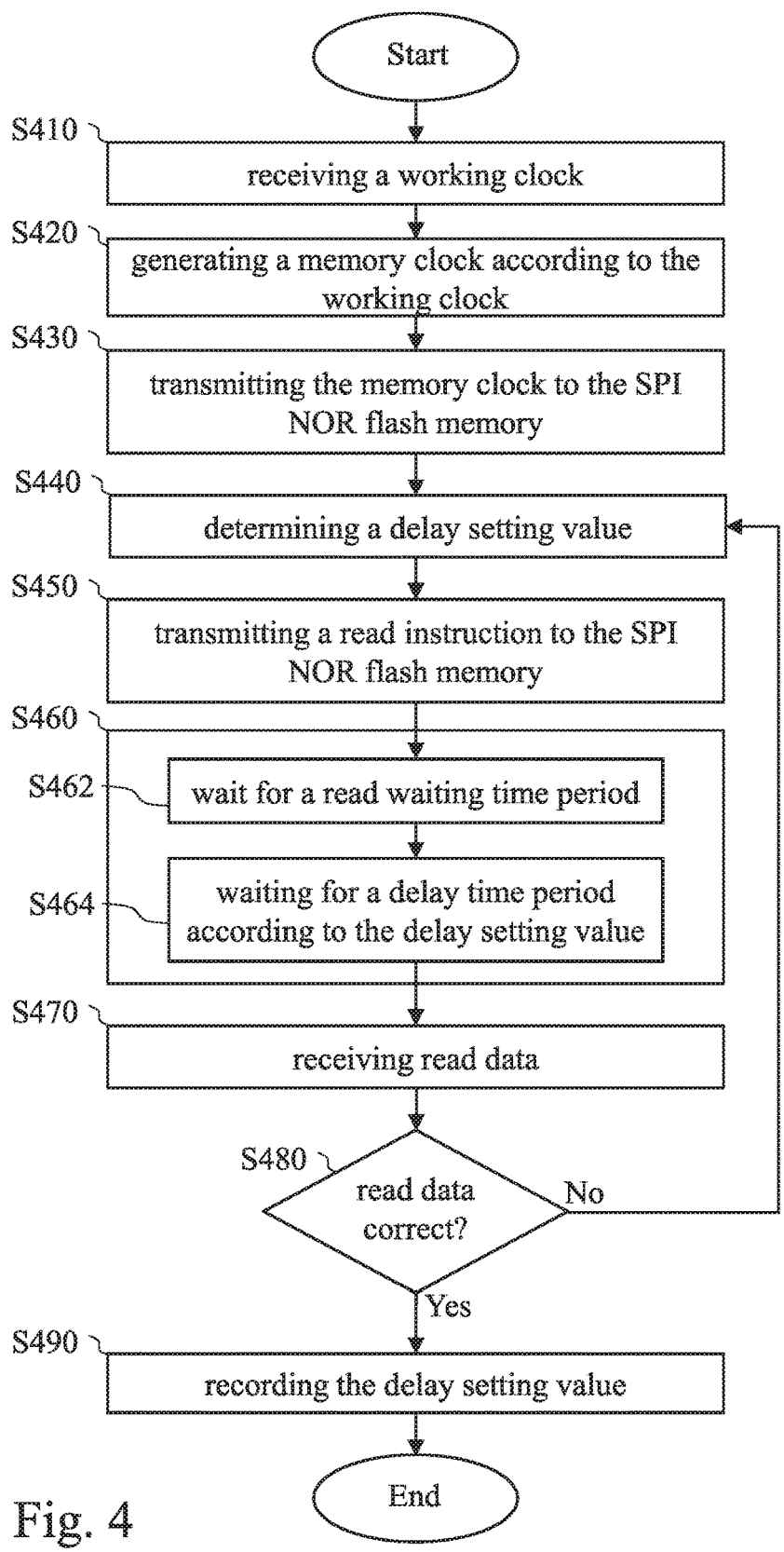
FIG. 4 illustrates a flowchart of a correction process of a memory control method according to an embodiment of the present invention.

FIG. 2 shows a function block diagram of a memory control circuit according to an embodiment of the present invention. Referring to FIG. 2, a memory control circuit 200 is capable of performing a correction process and a normal operation process. FIG. 3 is a timing diagram of a read operation corresponding to FIG. 2. FIG. 4 shows a flowchart of a correction process of a memory control method according to an embodiment of the present invention. The memory control circuit 200 includes an interface control unit 210, a data control unit 220, a register 230, a buffer 240 and a serial control unit 250. Referring to FIGS. 2, 3 and 4, the interface control unit 210 receives a working clock BUS_CLK (step S410). The working clock BUS_CLK is, for example, generated by a phase-locked loop (PLL) of a system-on chip (SoC) including the memory control circuit 200. The interface control unit 210, the data control unit 220 and the serial control unit 250 operate according to the working clock BUS_CLK. The serial control unit 250 generates a memory clock SPI_CLK (step S420) that the SPI NOR flash memory 201 needs according to the working clock BUS_CLK, and transmits the memory clock SPI_CLK to the SPI NOR flash memory 201 (step S430). More specifically, the serial control unit 250 includes a frequency dividing circuit (not shown), which divides the working clock BUS_CLK by N (where N is greater than or equal to 2) to obtain the memory clock SPI_CLK. The SPI NOR flash memory 201 operates according to the memory clock SPI_CLK. Next, the data control unit 220 determines a delay setting value (step S440). The delay setting value may be generated by the data control unit 220 by means of software/firmware, or be entered by a user (stored to the register 230 via the interface control unit 210). The data control unit 220 then transmits a read instruction via the serial control unit 250 (through an SPI_SI signal) to the SPI NOR flash memory 201 (step S450). As shown in FIG. 3, the data control unit 220 sends a read command Read_cmd at a time point T1, and sends a read address Addr immediately after the read command is completely transmitted (at a time point T2) (the read command Read_cmd and the read address Addr are collectively referred to as a read instruction). The read address Addr is completely transmitted at a time point T3.

Based on the definition of the specification of the SPI NOR flash memory 201, after the read instruction is completely transmitted, according to a predetermined instruction, the memory control circuit 200 needs to wait for a read waiting time period 310 before it can receive read data SPI_SO transmitted by the SPI NOR flash memory 201 (step S462). Thus, ideally, the memory control circuit 200 can immediately receive the read data SPI_SO after the read waiting time period 310 ends (at a time point T4). For example, the standard of the SPI NOR flash memory 201 may specify the read waiting time period 310 to be K times of a cycle of the memory clock SPI_CLK, where K is an integer. However, due to signal delay on the circuit board and/or in-chip signal delay, delayed read data SPI_SO_delay arrives only after a tune point T5. To overcome such data delay, the data control unit 220, according to the delay setting value and the working clock BUS_CLK, controls the serial control unit 250 to additionally wait for a delay time period 320 (step S464). That is to say, after transmitting the read instruction, the serial control unit 250 in total waits for a predetermined time period (which is equal to a sum of the read waiting time period 310 and the delay time period 320) (step S460) before it starts receiving the read data. The serial control unit 250 receives the read data in a unit of bits and stores the received read data in the buffer 240, and the data control unit 220 later fetches the read data in a unit of bytes from the buffer 240 (step S470). The data control unit 220 determines whether the read data is completely received according to an expected read data length, and compares the read data with correct data after the read data is completely received (step S480). The expected read data length is associated with the read command Read_cmd. In one embodiment, the read command Read_cmd and the expected read data length are inputted from the outside of the memory control circuit 200. In another embodiment, the read command Read_cmd (e.g., a read ID of a fixed-length device ID of the SPI NOR flash memory 201) and the expected read data length are built in the memory control circuit 200. For example but not limited to, the buffer 240 is a first-in-first-out (FIFO) buffer.

If the read data is correct, it means that the current delay time period 320 is sufficient for overcoming the signal delay on the circuit board and/or in-chip signal delay, and so the data control unit 220 records the delay setting value corresponding to the current delay time period 320 (step S490) for the memory control circuit 200 to later use in a normal operation mode. Conversely, if the read data is incorrect, step S440 is iterated to determine another delay setting value (e.g., increasing the delay time period 320 to x cycles of the working clock BUS_CLK, where x is a positive integer), followed by again performing steps S450 to S480. Taking FIG. 3 for instance, the data control unit 220 eventually determines that the delay time period 320 is twice the cycle of the working clock BUS_CLK (i.e., the delay setting value may be determined to be 2), and the subsequent data reading process begins at a time point T6 to ensure that data can be correctly received. It should be noted that, the delay setting value may also be determined to be 3, i.e., the subsequent data reading process begins at a time point T7. A signal SPI_CSN in FIG. 3 is a chip selection signal for selecting a predetermined module of the SPI NOR flash memory 201.

Figure 5:
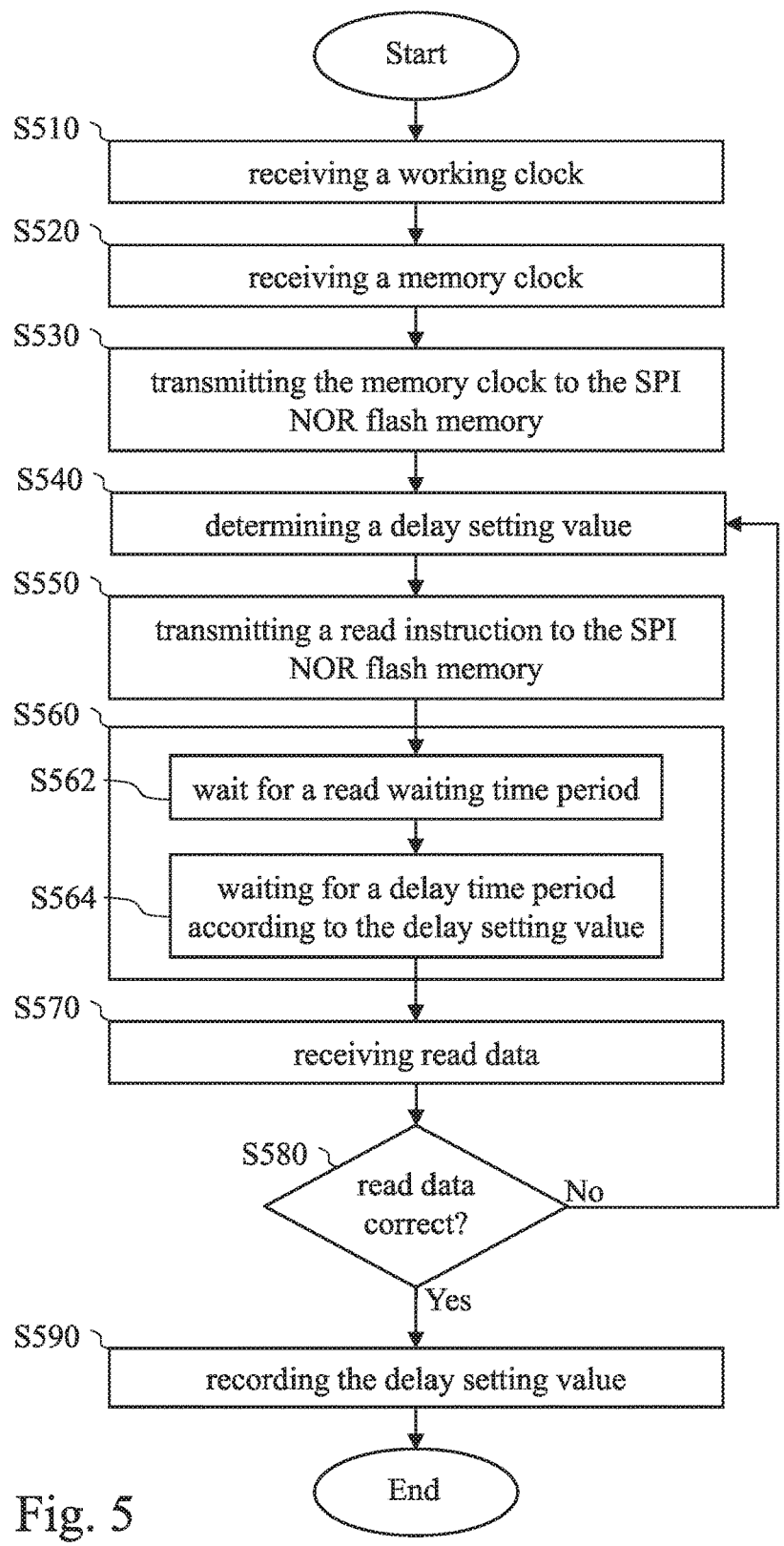
FIG. 5 illustrates a flowchart of a correction process of a memory control method according to another embodiment of the present invention.

In a different embodiment, the memory clock SPI_CLK may be provided from the outside of the memory control circuit 200 (e.g., similarly generated by the foregoing PLL) instead of by the serial control unit 250 through frequency dividing. Thus, the frequency dividing circuit may be omitted from the serial control unit 250. FIG. 5 shows a flowchart of a correction process of a memory control method according to another embodiment of the present invention. The memory control circuit 200 receives the working clock BUS_CLK and the memory clock SPI_CLK through the interface control unit 210 (steps S510 and S520), and details of the remaining steps are identical to those in FIG. 4 and shall be omitted herein.

Figure 6:
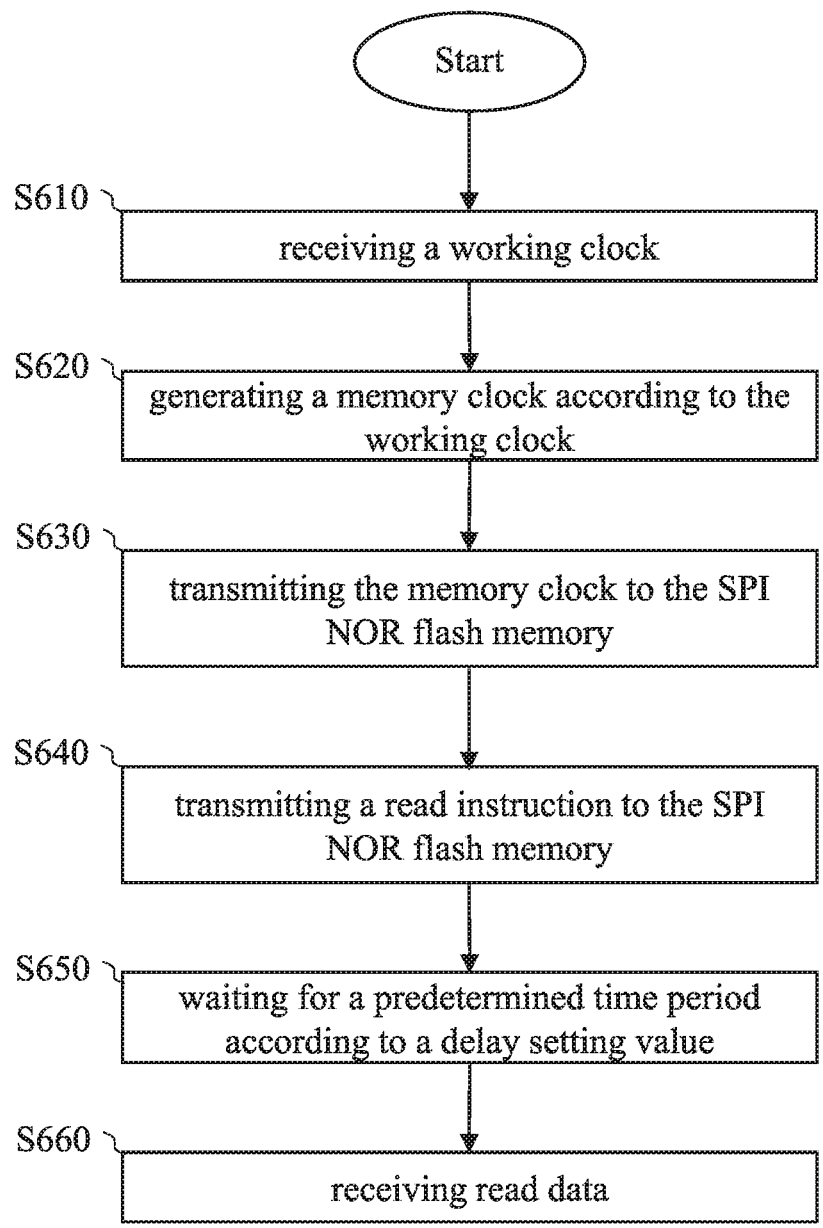
FIG. 6 illustrates a flowchart of a normal operation process of a memory control method according to an embodiment of the present invention.

FIG. 6 shows a flowchart of a normal operation process of a memory control method according to an embodiment of the present invention. Steps S610 to S630 are similar or identical to steps S410 to S430, and shall be omitted herein. In step S640, the data control unit 220 transmits a read instruction to the SPI NOR flash memory 201 via the serial control unit 250. Next, the data control unit 220, according to the delay setting value, controls the serial control unit 250 to wait for a predetermined time period before it receives the read data, e.g., through counting M cycles of working clock BUS_CLK by a counter (not shown), where M is the delay setting value. The predetermined time period includes the read waiting time period 310 and the delay time period 320 in FIG. 3. After the predetermined time period is reached, the data control unit 220 controls the serial control unit 250 to start receiving the read data (step S660).

Figure 7:
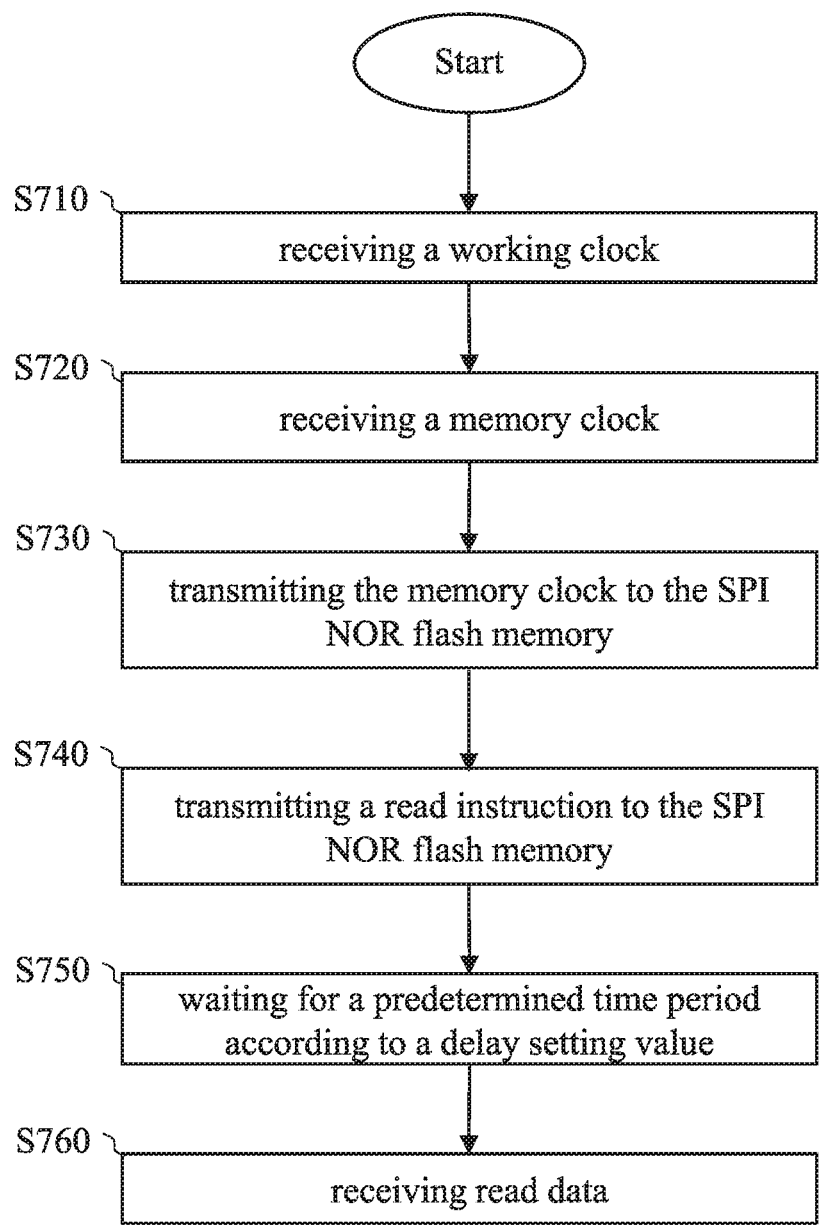
FIG. 7 illustrates a flowchart of a normal operation process of a memory control method according to another embodiment of the present invention.

FIG. 7 shows a flowchart of a normal operation process of a memory control method according to another embodiment of the present invention. FIG. 7 corresponds to the correction process in FIG. 5, and differs from FIG. 6 by step S720, in which the memory control circuit 200 receives the memory clock SPI_CLK instead of generating it. The remaining steps in FIG. 7 are identical to those in FIG. 6, and shall be omitted herein.

When the length of a routing between the memory control circuit 200 and the SPI NOR flash memory 201 changes, the present invention is capable of obtaining a preferable delay setting value to overcome the signal delay by performing only one correction process, thereby providing operation flexibilities. Further, because the frequency of the working clock BUS_CLK is higher than the frequency of the memory clock SPI_CLK and the delay time period is generated according to the working clock BUS_CLK, the precision of the delay time period is higher than the read waiting time period. Further, as the ratio of the frequency of the working clock BUS_CLK to the frequency of the memory clock SPI_CLK gets larger, the predetermined time period may be more finely adjusted.

The interface control unit 210, the data control unit 220, and the serial control unit 250 can be implemented by hardware (e.g., circuits), software, and/or firmware. When these units are implemented by software and/or firmware, the memory control circuit 200 may incorporate a processor, a controller, an MCU (micro control unit) or the like to execute program codes or instructions stored in a memory to realize the functions of each unit.

It should be noted that, the shapes, sizes and ratios of the elements, and the orders of the steps in the drawings are illustrative, and are for one person skilled in the art to better understand the present invention rather than limitations to the present invention. Further, a single-port SIP NOR flash memory is taken as an example in the foregoing embodiments, and is not to be construed as a limitation to the present invention. Based on the disclosure of the present invention, one person skilled in the art can appropriately apply the present invention to other types of SPI NOR flash memory, e.g., a multi-port SPI NOR flash memory.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A memory control circuit, for controlling a serial peripheral interface (SPI) NOR flash memory, said SPI NOR flash memory operating according to a first clock, said memory control circuit comprising:
   an interface control unit, for receiving a second clock;
   a serial control unit, coupled to said interface control unit and operating according to said second clock, for transmitting said first clock and a read instruction to said SPI NOR flash memory, and receiving read data; and
   a data control unit, coupled to said interface control unit and said serial control unit, for controlling said serial control unit according to a delay setting value to wait for a predetermined time period before receiving said read data;
   wherein, said predetermined time period includes a delay time period and a read waiting time period required by said SPI NOR flash memory, said read waiting time period is a multiple of a cycle of said first clock, said delay time period is a multiple of a cycle of said second clock, and said first clock is different from said second clock.

2. The memory control circuit according to claim 1, wherein a frequency of said second clock is N times of a frequency of said first clock, where N is an integer greater than or equal to 2.

3. The memory control circuit according to claim 2, wherein said first clock is externally provided or generated by said interface control unit according to said second clock.

4. The memory control circuit according to claim 1, wherein said interface control unit further receives an expected read data length, and said data control unit determines whether said read data is completely received according to said expected read data length.

5. A memory control method, for controlling a serial peripheral interface (SPI) NOR flash memory, said SPI NOR flash memory operating according to a first clock, said method comprising:
   receiving a second clock;
   transmitting said first clock and a read instruction to said SPI NOR flash memory;
   waiting for a predetermined time period according to a delay setting value before receiving read data; and
   receiving said read data;
   wherein, said predetermined time period includes a delay time period and a read waiting time period required by said SPI NOR flash memory, said read waiting time period is a multiple of a cycle of said first clock, said delay time period is a multiple of a cycle of said second clock, and said first clock is different from said second clock.

6. The memory control method according to claim 5, further comprising:
   generating said first clock according to said second clock, wherein a frequency of said second clock is N times of a frequency of said first clock, where N is an integer greater than or equal to 2.

7. The memory control method according to claim 5, further comprising:
   determining whether said read data is completely received according to an expected read data length.

8. A memory control method, for controlling a serial peripheral interface (SPI) NOR flash memory, said SPI NOR flash memory operating according to a first clock, said method comprising:
   transmitting said first clock to said SPI NOR flash memory;
   transmitting a read instruction to said SPI NOR flash memory;
   waiting for a read waiting time period, wherein said read waiting me period is associated with a specification of said SPI NOR flash memory and a cycle of said first clock;
   waiting for a delay time period, wherein said delay time period is associated with a delay setting value and a cycle of a second clock, and said first clock is different from said second clock;
   receiving read data returned from said SPI NOR flash memory; and
   adjusting said delay time period.

9. The memory control method according to claim 8, further comprising:

generating said first clock according to said second clock, wherein a frequency of said second clock is N times of a frequency of said first clock, where N is an integer greater than or equal to 2.

10. The memory control method according to claim 8, further comprising:
    receiving an expected read data length; and
    determining whether said read data is completely received according to an expected read data length.

* * * * *